United States Patent [19]
Kokaku et al.

[11] Patent Number: 4,863,557
[45] Date of Patent: Sep. 5, 1989

[54] PATTERN FORMING PROCESS AND THIN-FILM MAGNETIC HEAD FORMED BY SAID PROCESS

[76] Inventors: Yuuichi Kokaku, Hitachi-hachimanyama apartment 527, Yoshida-cho 1545, Totsuka-ku, Yokohama-city, Kanagawa; Makoto Kitou, Izumi-cho 1677-12, Izumi-ku, Yokohama-city, Kanagawa, Japan

[21] Appl. No.: 198,197

[22] Filed: May 25, 1988

[30] Foreign Application Priority Data

May 29, 1987 [JP] Japan .................................. 62-131412

[51] Int. Cl.⁴ .......................... B44C 1/22; C23F 1/02; C03C 15/00; C03C 25/06
[52] U.S. Cl. .................................. 156/643; 156/646; 156/652; 156/655; 156/656; 156/659.1; 156/661.1; 156/662; 156/667; 156/904; 360/122; 427/38; 427/130; 427/131; 428/694; 204/192.32

[58] Field of Search ............... 156/643, 646, 652, 653, 156/655, 656, 657, 659.1, 661.1, 662, 667, 904; 427/130, 131, 132, 43.1, 38, 39; 360/110, 119, 120, 121, 122; 29/603; 204/192.32, 192.35, 192.37; 428/694

[56] References Cited

U.S. PATENT DOCUMENTS

| | | |
|---|---|---|
| 4,599,137 | 7/1986 | Akiya ............................. 427/43.1 X |
| 4,613,398 | 9/1986 | Chiong et al. ................. 427/43.1 X |
| 4,677,036 | 6/1987 | Nakamura et al. ............ 427/130 X |
| 4,780,354 | 10/1988 | Nakayama et al. ............. 427/131 X |

Primary Examiner—William A. Powell
Attorney, Agent, or Firm—Kenyon & Kenyon

[57] ABSTRACT

Disclosed herein are a pattern forming process, particularly the one by lithography for fine fabrication, and a thin-film magnetic head formed by said process. The present invention provides a process for accurately fabricating a substrate having a stepped surface by dry etching, using as the mask a resist film formed by plasma polymerization. Plasma polymerization forms a uniform photosensitive resist film on a stepped surface, and the resist film can be used as the mask for the ion milling of the substrate.

24 Claims, 4 Drawing Sheets

FIG. 1
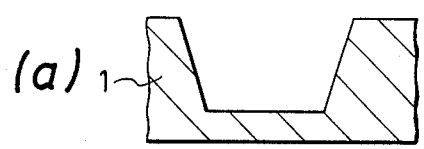
(a)
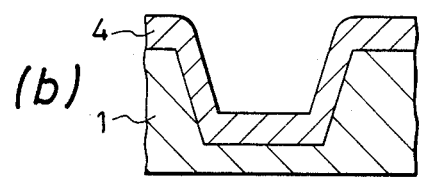
(b)
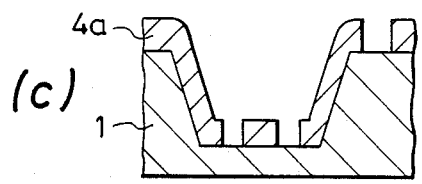
(c)
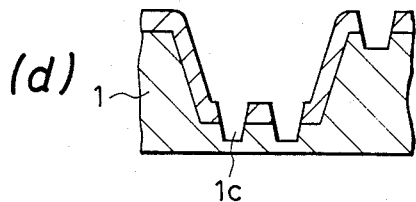
(d)
FIG. 2
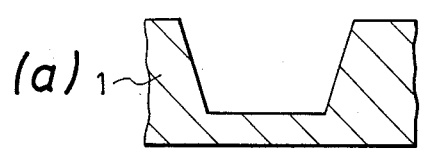
(a)
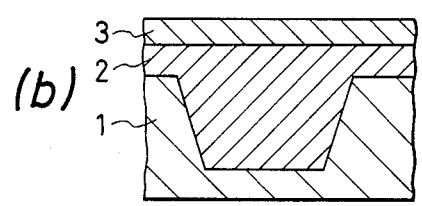
(b)
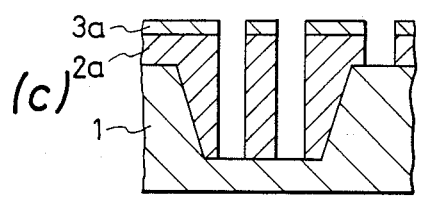
(c)
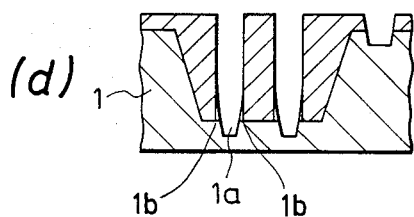
(d)

FIG. 6
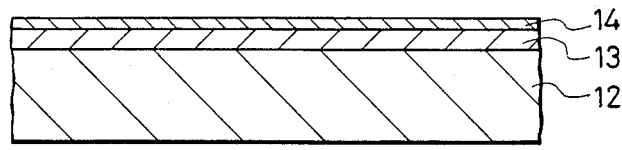
(a)
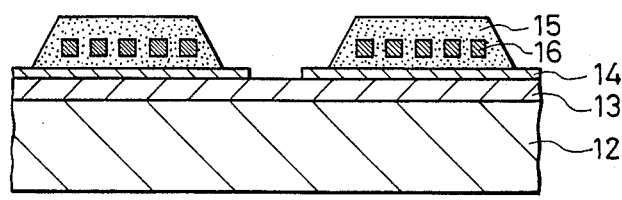
(b)
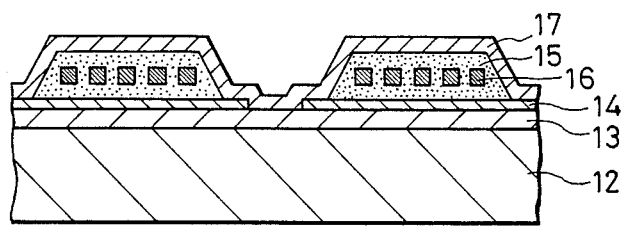
(c)
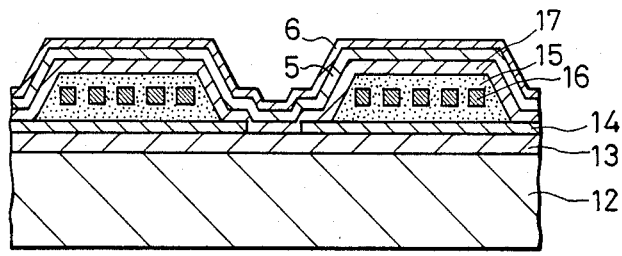
(d)
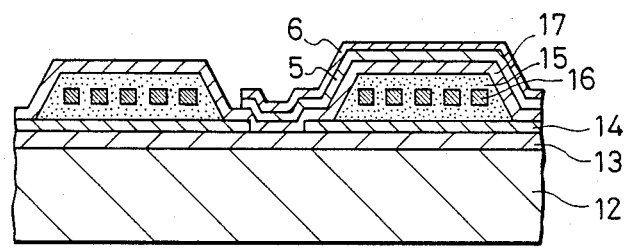
(e)
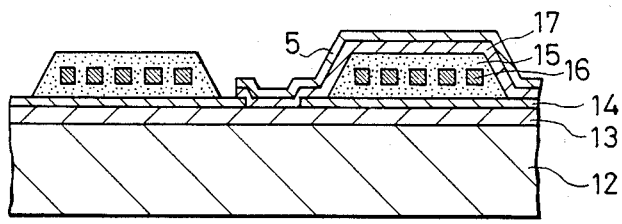
(f)

PATTERN FORMING PROCESS AND THIN-FILM MAGNETIC HEAD FORMED BY SAID PROCESS

BACKGROUND OF THE INVENTION

The present invention relates to a pattern forming process, particularly one by lithography for fine fabrication, and also to a thin-film magnetic head formed by said process.

It is a common process of forming a desired pattern on a substrate to coat the substrate with a resist film in conformity with the pattern and then remove the uncoated part of the substrate by means of ion milling. This process is essential for the fine fabrication of those materials which are unsuitable for wet etching or reactive dry etching. The resist used for this process includes, for example, phenol novolak resist, AZ-1350J, made by Shiplay Company. The resist film is formed by the spin coating method which involves the steps of dropping a resist solution of proper viscosity onto a rotating substrate, thereby causing an excess of the resist solution to be driven out by centrifugal force, and drying the remaining resist solution.

The spin coating method, however, does not provide a uniform coating on a substrate having a stepped surface. This is a problem in the production of highly integrated circuits containing multilayered elements and conductors and also in the ever-expanding application areas of thin-film technology. A solution to this problem is the dual layer resist method. This method is applied to the patterning of a substrate 1 having a stepped surface as shown in FIG. 2a. According to this method, at first, a thick resist coating 2 is formed on a substrate 1, and it is flattened. (The resist coating is simply referred to as resist hereinafter.) Then, a second resist 3 is formed on said thick resist 2. Said second resist 3 undergoes exposure and development to form a resist pattern 3a. Using this resist pattern 3a as a mask, the first resist 2 undergoes reactive ion etching by oxygen plasma, so that the resist pattern 2a is formed as shown in FIG. 2c. Using the resist pattern 2a as a mask, the substrate 1 undergoes etching. Thus, the etching Ia of the substrate is performed as shown in FIG. 2d. Incidentally, the dual layer resist method is disclosed in "Dual Layer Resist Material Used for Pattern Transfer by RIE", by E. Reihimanis, G. Smolinsky, and C. W. Wilkins, Jr., Solid Stage Technology (Japanese Version), 1985, 10, pp. 52-57.

The above-mentioned dual layer method poses a serious problem in the case where the pattern is formed by dry etching method, especially physical sputtering method. This problem arises from the fact that the resist pattern formed by the dual layer method has a large thickness, especially in the hollow part of the substrate, and also has nearly vertical etched walls. The deep vertical etched walls cause the particles ejected from the substrate by physical sputtering (such as ion milling and reactive ion etching) to redeposit on them. The redeposited particles, which are indicated by 1a in in FIG. 2d cause dimensional errors or erroneous cross section to the pattern.

SUMMARY OF THE INVENTION

The present invention was completed to overcome the above-mentioned disadvantage. Accordingly, it is an object of the present invention to provide a process for accurately fabricating a substrate having a stepped surface by dry etching based mainly on physical sputtering.

The first aspect of the present invention is a pattern forming process which comprises forming a resist film on a substrate having a stepped surface by plasma polymerization, patterning said resist film, and etching that part of the substrate which is not covered with said resist film, thereby forming a pattern on said substrate.

The second aspect of the present invention is a pattern forming process which comprises forming a first resist film on a substrate having a stepped surface, forming a second resist film on said first resist film by plasma polymerization, patterning said second resist film, patterning said first resist film using said patterned second resist film as a mask, and etching that part of the substrate which is not covered with said first and second resist films.

The process pertaining to the second aspect of the present invention is illustrated in FIG. 3. This process is characterized by forming resist films in dual layers. The top layer 6 is patterned by photolithography in the usual way, and the under layer 5 is patterned by using the top layer 6 as a mask. Finally, the substrate 1 is etched to form the conductor layer 10 by using the top layer 6 and the under layer 6 as a mask. After etching, the top layer 6 and under layer 5 may be removed; but they may also be left unremoved so that they function as protective layers or insulation layers.

The process for forming a resist film directly on a substrate by plasma polymerization is disclosed in Japanese Patent Laid-open No. 66938/1983 filed by the present applicant. However, it was first found by the present inventors that it is a resist film formed by plasma polymerization which produces a profound effect on the fabrication of a substrate having a greatly stepped surface.

According to the present invention, a resist film of uniform thickness is formed on the stepped surface of a substrate and such a resist film is formed by plasma polymerization. The process of the present invention may be applied to a stepped surface of a substrate, with the difference in level being 5 to 30 $\mu$m.

The pattern forming process pertaining to the first aspect of the present invention is described below with reference to FIG. 1. At first, a substrate 1 having a greatly stepped surface, as shown in FIG. 1a, is entirely covered with a resist film 4 which is formed by plasma polymerization, as shown in FIG. 1b. This resist film 4 can be patterned because it changes in solubility toward a specific solvent upon reactions induced by irradiation with ultraviolet rays, far ultraviolet rays, X-rays, electron rays, or the like. After exposure and development, there is obtained the patterned resist film 4a as shown in FIG. 1c. The substrate 1 covered with the patterned resist film 4a is etched by ion milling with argon ions. Thus there is obtained the etched pattern 1c as shown in FIG. 1d.

The advantage of the process of the present invention over the conventional process will be apparent from the comparison of FIG. 1d with FIG. 2d. According to the conventional process, the etching of the substrate is carried out as shown in FIG. 2d. It should be noted that the resist pattern has a large thickness and nearly vertical etched walls. The deep vertical etched walls cause the particles ejected from the substrate by sputtering (such as ion milling) to redeposit on them. The redeposited particles adversely affect the precision of fabrication. By contrast, the process of the present invention, which is free from redeposited particles, permits accurate fabrication.

The resist film 4 formed by plasma polymerization is produced from a monomer capable of forming a photosensitive polymer compound. This monomer is used alone or in combination with a vapor of other organic compounds or an inert gas such as argon, nitrogen, and helium. The raw material gas is polymerized in the plasma state so that the resulting polymer compound deposits on the substrate. For a positive resist, the monomer should be selected from methyl methacrylate, methyl acrylate, methyl isopropenyl ketone, etc. For a negative resist, the monomer should be selected from styrene, o-chlorostyrene, p-chlorostyrene, chloromethylstyrene, glycidyl methacrylate, glycidyl vinyl ether, ally methacrylate, etc.

The pattern forming process pertaining to the second aspect of the present invention is described below with reference to FIG. 3. It should be noted that the resist film is of double layered structure. The first layer 5 (under layer) is one which can be decomposed for removal by oxygen plasma. It is formed by plasma polymerization from an organic compound composed of elements selected from C, H, 0, and N. The second layer 6 (top layer) is photosensitive. It is formed by plasma polymerization from a vapor of a silicon-containing organic compound. The vapor may be used alone or in combination with a vapor of other organic compound. For the second layer 6 to be photosensitive, it should be made from a photosensitive silicon-containing organic compound or a silicon-containing organic compound in combination with a photosensitive organic compound. The former includes, for example, chloromethylvinylmethylsilane, chloromethylvinyldimethoxysilane, methacryloxytrimethylsilane, isopropenoxytrimethylsilane, etc., and the latter includes, for example, tetramethylsilane, vinyltrimethylsilane, divinyldimethylsilane, hexamethyldisilazane, hexamethyldisiloxane, tetramethoxysilane, vinyltrimethoxysilane, etc. They are readily vaporizable silicon-containing organic compounds.

The second layer 6 is intended for the patterning of the first layer 6. The patterning of the second layer 6 is accomplished by the ordinary exposure and wet development. After the patterning, the second layer 6 is subjected to oxygen plasma so that the silicon contained in the second layer 6 is oxidized into non-volatile $SiO_2$ which is not removed by oxygen plasma. Therefore, the first layer 5 alone is selectively removed and the same pattern as that of the second layer 6 is obtained. The second layer 6 may be as thin as 0.1 to 0.5 μm, depending on the content of silicon, so long as it is thick enough to form the $SiO_2$ layer The first layer 5 functions as a mask for the subsequent ion milling. It should be resistant to heat because ion milling generates heat and also resistant to ion milling. This requirement is met by forming a film having a high degree of crosslinking by plasma polymerization, preferably by forming a carbon film by one of the following processes.

(1) Plasma-assisted chemical vapor deposition process. (A carbon film is deposited by the decomposition of a hydrocarbon-containing gas in plasma.)
(2) Chemical vapor deposition process. (A carbon film is deposited by the thermal decomposition of a hydrocarbon-containing gas.)
(3) Sputtering process. (A carbon film is deposited by sputtering, with graphite carbon being a target.)
(4) Ion beam deposition process. (A carbon film is deposited by colliding an ionized, accelerated hydrocarbon gas against a substrate The process for plasma polymerization performed in the present invention will be described below with reference to FIG. 4, in which there is shown a vacuum chamber 9 provided with parallel electrodes 7 and 8. With the pressure in the vacuum chamber 9 kept constant by introducing a monomer vapor at a constant flow rate and adjusting the discharge rate, a voltage is applied to the electrode 7 from the high frequency (13.56 MHz) source 10 so as to generate plasma which brings about plasma polymerization. The substrate 11 is placed on the electrode 8 to which no voltage is applied. The monomer pressure should be in the range of 0.01 to 5 Torr. The high-frequency power should be in the rage of 0.01 to 10 $W/cm^2$ (electrode area). With the monomer pressure and electric power outside the above-mentioned range, no plasma or unstable plasma will be generated. The foregoing is a mere example; and the high-frequency voltage ma be replaced by a DC or AC voltage or microwave.

The pattern forming process of the present invention is greatly effective in the fabrication of a thin-film head, three-dimensional ICs, optical integrated circuit, sensor, etc. on a substrate having a stepped surface.

According to the process of the present invention, a resist film is formed by plasma polymerization and consequently the resist film has a uniform thickness even though there is difference in level on the surface of the substrate. Therefore, the pattern forming process of the present invention permits accurate fine fabrication of a substrate having a greatly stepped surface.

BRIEF DESCRIPTION OF THE DRAWINGS

FIGS. 1a to 1d are schematic diagrams illustrating the process of forming a pattern in one example of the present invention.

FIGS. 2a to 2d are schematic diagrams illustrating the conventional process of forming a pattern.

FIGS. 6a to 6f are schematic sectional views, each taken along the line X—X in FIG. 5, showing the process of producing the thin-film magnetic head by the pattern forming process of the present invention.

DETAILED DESCRIPTION OF THE PREFERRED EMBODIMENTS

The invention will be described in more detail with reference to the following examples.

EXAMPLE 1

Figure 3:
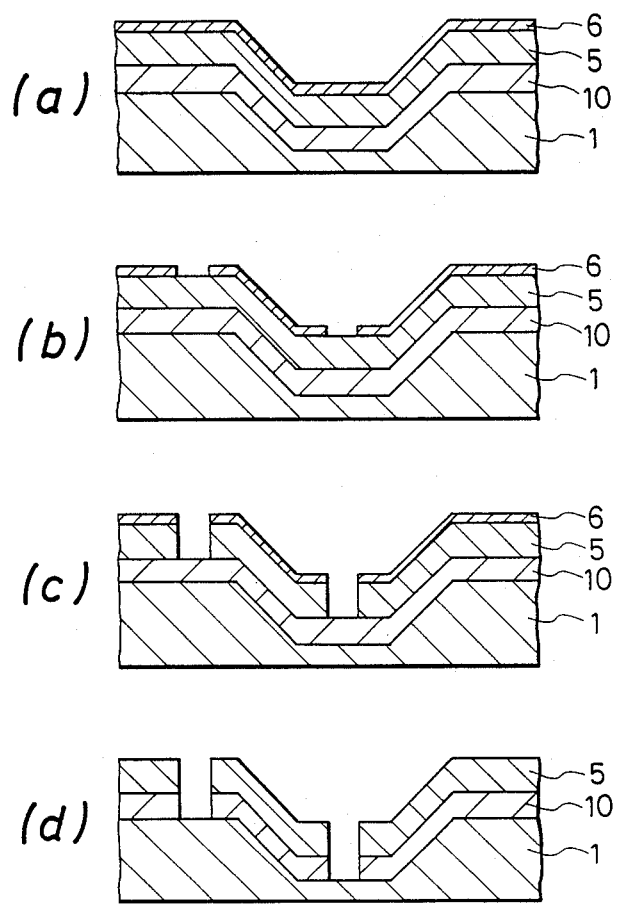
FIGS. 3a to 3d are schematic diagrams illustrating the process of forming a pattern in another example of the present invention.
Figure 4:
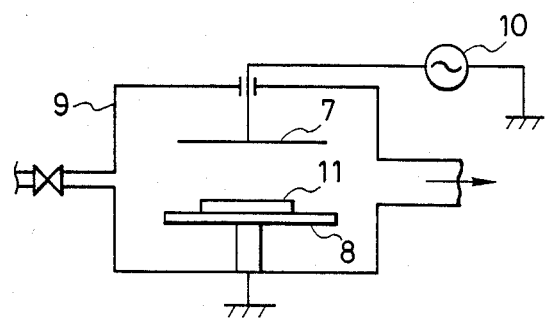
FIG. 4 is a schematic diagram illustrating the apparatus for plasma polymerization performed according to the present invention.

A stainless steel substrate having a groove, 10 μm deep and 50 μm wide, was placed in a reactor of the high-frequency plasma generator provided with parallel flat electrodes as shown in FIG. 4. With the reactor pressure kept at 0.05 Torr by introducing chloromethylstyrene, a high-frequency power of 2.0 W was applied to generate plasma for plasma polymerization. Thus there was formed a 1.0 μm thick polymer film on the substrate. The polymer film was exposed to far ultraviolet rays (200 mJ/cm$^2$) through a mask having a line-and-space pattern (5.0 μm wide). The exposed polymer film was developed by dipping in methyl ethyl ketone. Thus there was formed a 0.7 μm thick negative resist pattern. Subsequently, the substrate was etched to with argon ions. The etched line-and-space pattern was found to have a line width of 5.0±0.2 μm. In other words, the error of fabrication was within ±4%. The pattern configuration was good.

COMPARATIVE EXAMPLE 1

The same stainless steel substrate as used in Example 1 was coated with phenol novolak resin (resist) by the spin coating method. The resist coating was smoothed by prebaking at 150° C. for 1 hour. The resist coating was further coated with a solution in methyl ethyl ketone of partly trimethylsilylated poly(chloromethylstyrene) by the spin coating method. The coating thickness was 1 μm and the coating was dried. The thus formed resist film was exposed to far ultraviolet rays (50 mJ/cm$^2$), with a mask in close contact with it. (The mask was identical with that used in Example 1.) The exposed resist film was developed with methyl ethyl ketone. The first resist layer was selectively removed using a plasma etching apparatus of parallel electrode type in which the oxygen pressure was kept at 0.1 Torr and a high-frequency power of 500 W was applied. (In other words, that part of the first resist layer which is not covered by the second resist layer was removed.) The substrate was subjected to ion milling in the same manner as in Example 1, and then the resist layers were removed. The line-and-space pattern formed on the substrate was such that the etched groove is 3.2±1 μm wide and the unetched part is 6.8±1 μm wide. In addition, the edges of the groove have projections resulting from redeposition, and the pattern configuration was poor.

EXAMPLE 2

A silicon substrate having a 5 μm deep etched groove was coated with a 1 μm alumina film by sputtering. The substrate was placed in a high-frequency plasma generating apparatus of parallel flat electrode type. (It was placed on the electrode to which a high-frequency power is applied.) Plasma was generated for 30 minutes in a flow of toluene as the raw material gas. The discharge power was 100 W and the gas flow rate was 10 sccm. There was formed a 2 μm thick amorphous carbon film. The substrate was moved to the grounded electrode in the plasma generating apparatus. Plasma was generated for 10 minutes at a discharge voltage of 100 W by introducing into the reaction chamber methyl isopropenyl ketone at a flow rate of 10 sccm and vinyltrimethylsilane at a flow rate of 3 sccm. There was formed a 3000Å thick polymer film on the substrate.

The coated substrate was exposed to far ultraviolet rays through a chromium mask of 3 μm line-and-space pattern, followed by development with a 1:5 (by weight) mixture of methyl ethyl ketone and isopropanol and rinsing with ethanol. There was obtained a positive type resist pattern of plasma-polymerized film.

The resist-coated substrate was placed in a plasma etching apparatus of parallel electrode type and subjected to plasma etching with oxygen for 10 minutes. The gas pressure was 0.05 Torr and the electric power was 800 W. That part of the carbon film which is not covered with the plasma-polymerized film was selectively etched, and the pattern was transferred to the carbon film.

The resist-coated substrate underwent ion milling with argon ions accelerated by 500 V energy. That part of the alumina which is not covered with carbon was selectively removed. The substrate was placed again in a plasma etching apparatus of parallel electrode type. The remaining carbon film was removed by means of oxygen plasma. Thus there was formed a line-and-space pattern on the alumina. The precision of fabrication was 3±0.2 μm for all the parts of the etched groove.

EXAMPLE 3

On a silicon substrate was formed a plasma-polymerized film and a patterned carbon film in the same manner as in Example 2. This substrate was placed in a high-frequency plasma etching apparatus of internal electrode type and subjected to reactive ion etching under the following conditions. Gas: CF, gas pressure: 6 Pa, and electric power: 500 W. After 10 minute etching, there was formed a line-and-space pattern on the alumina as in Example 2. The precision of fabrication was 3±0.25 μm for all the parts of the etched groove.

EXAMPLE 4

Figure 5:
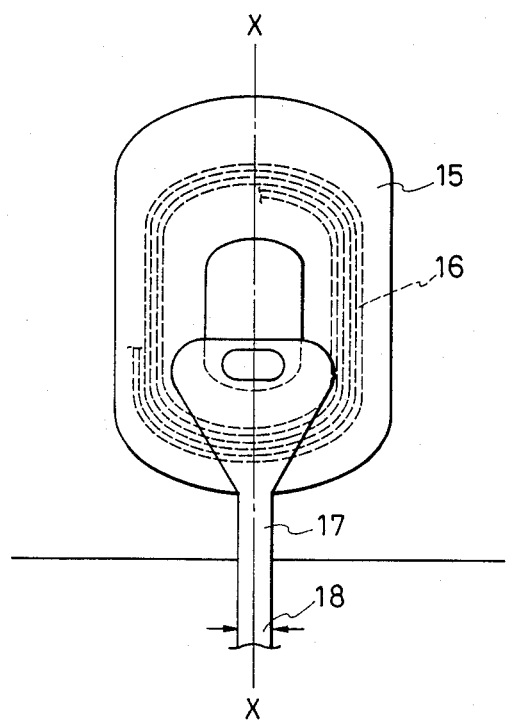
FIG. 5 is a plan view showing an important part of a thin-film magnetic head produced by the pattern forming process of the present invention.

In this example, the process of the invention was applied to the fabrication of permalloy thin-film magnetic head, as illustrated in FIGS. 5 and 6. FIG. 5 is a plan view showing an important part of the thin-film magnetic head, and FIG. 6 is a sectional view taken along the line X—X in FIG. 5.

On a zirconia substrate 12 were formed a lower magnetic layer 13, a gap layer 14, an insulation layer 15, and a coil 16. (FIG. 6a and FIG. 6b) An upper magnetic layer 17 (2 μm thick permalloy thin film) was formed by sputtering. (FIG. 6c) The thus obtained layered product had a difference in level of 12 μm between the highest part and the lowest part. On this layered product were formed a carbon film 5 and a plasma-polymerized resist 6 in the same manner as in Example 2. (FIG. 6d) The resist was exposed, followed by development, to form the carbon pattern. (FIG. 6e) The upper magnetic layer 17 was subjected to ion milling. Thus there was obtained a thin-film head element as shown in FIG. 6f. The thus obtained thin-film magnetic head was found to have a track width 18 of 10±0.4 μm (the narrow part of the upper magnetic layer 17). It was quite satisfactory in practical use.

For comparison, a thick resist layer of phenol novolak was formed by spin coating method and the resist was subjected to ion milling. In this case, the track width was 12.2±1.5 μm and the edge had projections on account of the redeposition of permalloy. The thus obtained thin-film magnetic head was of no practical use because of great fluctuation in magnetic performance.

EXAMPLE 5

The procedure of Example 4 was repeated except that a 20 μm thick protective layer of alumina was formed by sputtering without removing the carbon film after the patterning of the upper magnetic layer. The thin-film magnetic head was produced by machining. The performance of this thin-film magnetic head was evaluated by performing actual writing and reading with it built into a magnetic disk unit. It was found that the carbon film does not adversely affect the performance for practical use. This result suggests that it is possible to omit the step of removing the resist after the patterning of the upper magnetic layer, or it is possible to simplify the process for producing the thin-film magnetic head.

The above-mentioned examples demonstrate that the present invention produces the effect of forming a uniform resist film on a substrate having a stepped surface, minimizing the dimensional errors in etching, reducing the thickness of the resist film even in the hollow part of the stepped surface, eliminating the redeposition during ion milling, and improving the precision and sectional configuration of the pattern. Thus the present invention provides a pattern forming process which permits accurate fine fabrication of a substrate having a greatly stepped surface by dry etching based on physical sputtering. Therefore, it is of great industrial use.

What is claimed is:

1. A pattern forming process which comprises forming a resist film on a substrate having a stepped surface by plasma polymerization, patterning said resist film, and removing that part of the substrate which is not covered with said resist film, thereby forming a pattern on said substrate.

2. A pattern forming process as claimed in claim 1, wherein the removing of the substrate is performed by dry etching.

3. A pattern forming process as claimed in claim 2, wherein the plasma polymerization is performed by using as the raw material gas a monomer capable of forming a photosensitive polymer compound.

4. A pattern forming process as claimed in claim 2, wherein the plasma polymerization is performed by using as the raw material gas a mixture of a monomer capable of forming a photosensitive polymer compound and an inert gas or a vapor of an organic compound.

5. A pattern forming process as claimed in claim 1, wherein the stepped surface has a difference in level in the range of 5 $\mu$m to 30 $\mu$m.

6. A pattern forming process which comprises forming a first resist film on a substrate having a stepped surface, forming a second resist film on said first resist film by plasma polymerization, patterning said second resist film, patterning said first resist film using said patterned second resist film as a mask, and removing that part of the substrate which is not covered with said first and second resist films.

7. A pattern forming process as claimed in claim 6, wherein the first resist film is one which can be removed by oxygen plasma.

8. A pattern forming process as claimed in claim 6, wherein the second resist film is one which is photosensitive and resistant to oxygen plasma.

9. A pattern forming process as claimed in claim 6, wherein the second resist film is one which contains silicon and can form a resist pattern upon exposure to electromagnetic wave or corpuscular rays, followed by development.

10. A pattern forming process as claimed in claim 6, wherein the first resist film is formed by plasma polymerization.

11. A pattern forming process as claimed in claim 10, wherein the first resist film is one which contains carbon atoms.

12. A pattern forming process as claimed in claim 6, wherein the first resist film is one which is formed by plasma-assisted chemical vapor deposition method, chemical vapor deposition method, sputtering method, or ion beam deposition method.

13. A pattern forming process as claimed in claim 12, wherein the first resist film is one which is made of carbon.

14. A pattern forming process as claimed in claim 6, wherein the first resist film is used as an insulation layer or protective film.

15. An improved process for producing a thin-film magnetic head including the steps of forming a first magnetic layer, a gap layer of non-magnetic material, a coil, and a second magnetic layer on a non-magnetic substrate by thin-film technology, wherein said improvement comprises forming a resist film on said second magnetic layer by plasma polymerization, patterning said resist film, and removing the part of the second magnetic film which is not covered with the resist film, thereby fabricating the second magnetic layer which determines the track width for recording and reading.

16. A pattern forming process as claimed in claim 1, wherein the plasma polymerization is performed by using as the raw material gas a monomer capable of forming a photosensitive polymer compound.

17. An improved process for producing a thin-film magnetic head including the steps of forming a first magnetic layer, a gap layer of non-magnetic material, a coil, and a second magnetic layer on a non-magnetic substrate by thin-film technology, wherein said improvement comprises forming a first resist film on said second magnetic layer, forming a second resist film on said first resist film by plasma polymerization, patterning said second resist film, patterning said first resist film using said second resist film as a mask, and removing the part which is not covered with said first and second resist films, thereby fabricating the second magnetic layer which determines the track width for recording and reading.

18. A pattern forming process as claimed in claim 1, wherein the plasma polymerization is performed by using as the raw material gas a mixture of a monomer capable of forming a photosensitive polymer compound and an inert gas or vapor of an organic compound.

19. A pattern forming process as claimed in claim 12, wherein the first resist film is one which contains carbon atoms.

20. A thin-film magnetic head comprising a first magnetic layer on a non-magnetic substrate, a gap layer of non-magnetic material, a coil, a second magnetic layer, and a protective layer on said second magnetic layer wherein said protective layer is used as a resist film, being formed by plasma polymerization, being patterned, and a part of the second magnetic layer which is not covered with said resist film, is removed thereby fabricating the second magnetic layer which determines the track width for recording and reading.

21. A thin-film magnetic head comprising a first magnetic layer on a non-magnetic substrate, a gap layer of non-magnetic material, a coil, a second magnetic layer, and a protective layer on said second magnetic layer, wherein said protective layer is used as a first resist film, being patterned by using a second resist film formed on said first resist film by plasma polymerization as a mask, and said a part of the second magnetic layer which is not covered with said first and second resist film is removed, thereby fabricating the second magnetic layer which determines the track width for recording and reading.

22. A thin-film magnetic head as claimed in claim 21, wherein said first resist film is one which is formed by plasma polymerization.

23. A thin-film magnetic head as claimed in claim 21, wherein said first resist film is one which is made of carbon.

24. A thin-film magnetic head as claimed in claim 23, wherein said first resist film is one which is formed by plasma-assisted chemical vapor deposition method, sputtering method, or ion beam deposition method.

* * * * *